THERMOELECTRICITY

Original Filed Nov. 27, 1959 2 Sheets-Sheet 1

INVENTORS
DALE E. HILL
ARNOLD EPSTEIN
BY Herman O. Bauermeister
ATTORNEY

THERMO-ELECTRIC GENERATOR.

INVENTORS
DALE E. HILL AND
BY ARNOLD EPSTEIN
Herman O. Bauermeister
ATT'Y.

3,138,486

THERMOELECTRICITY

Dale E. Hill, Kirkwood, and Arnold Epstein, St. Louis, Mo., assignors to Monsanto Company, St. Louis, Mo., a corporation of Delaware Original application Nov. 27, 1959, Ser. No. 855,592. Divided and this application Aug. 31, 1962, Ser. No. 220,837
10 Claims. (Cl. 136—5)

The present invention relates to the use of crystalline boron phosphide for the direct conversion of heat to electricity as well as processes for heating and cooling.

It is an object of the present invention to provide thermoelectric materials for obtaining electricity from heat sources, particularly above 800° C. It has been found that the prior art materials which have thermoelectric generating properties cannot be employed at such elevated temperatures because of decomposition and the loss of useful thermoelectric properties.

Crystalline boron phosphide is hard, thermally stable and chemically inert.

The above-described boron phosphide may be prepared by a chemical reaction between elemental boron and elemental phosphorus, or in general a boron source and a phosphorus source.

It has also been found that boron phosphide is characterized by unusual thermal stability, e.g. low dissociation pressure. This is indicative of a high order of stability at elevated temperatures, so that this material can be used in thermoelectric applications without decomposition.

In using the hereindescribed composition for thermoelectric processes, the following electrical relationships and the data presented herein show the advantages of boron phosphide. The so-called "figure of merit," Z, is defined as the ratio of the Seebeck coefficient or thermoelectric power, S, squared to the product of the electrical resistivity, $\rho$ and thermal conductivity K $$Z=\frac{S^2}{\rho K}$$

(Semiconductor Thermoelements and Thermoelectric Cooling, p. 1, A. F. Ioffe, Infosearch Limited, London (1957).) The figure of merit, Z, can be seen to play an important role in thermoelectric devices used for heating, cooling, and power generation. In thermoelectric power generation, the theoretical maximum efficiency obtainable is related to Z in the following way:

$$\text{Efficiency}=\frac{T_1-T_0}{T_1}\times\frac{\sqrt{1+\frac{1}{2}Z(T_1+T_0)}-1}{\sqrt{1+\frac{1}{2}Z(T_1+T_0)}+\frac{T_0}{T_1}}$$

where $T_1$=temp. at hot junction
$T_0$=temp. at cold junction (Ibid., Part 1, Chapt. 2, p. 40, A. F. Ioffe.)

In the drawings of the present case

Figure 1:
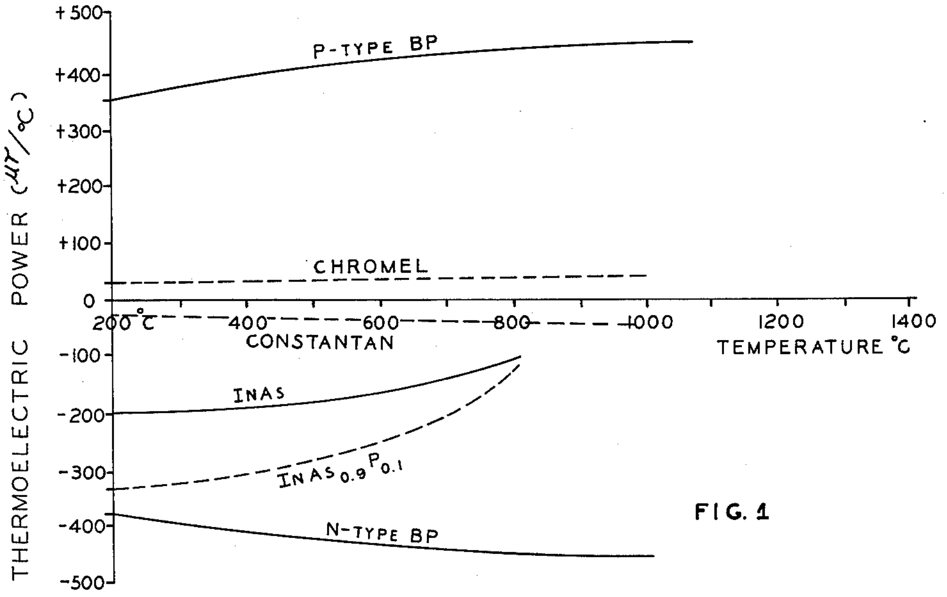
FIG. 1 shows the relationship between thermoelectric power and temperature for boron phosphide and other thermoelectric materials.

In FIG. 1, the property of thermoelectric power is shown in relation to temperature for a number of thermoelectric materials. The upper portion of the drawing includes P-type BP. It has been found that P-type BP compositions can be obtained by the presence or inclusion of P-type impurities such as zinc, mercury, cadmium, beryllium or magnesium. For comparison, a conventional P-type material, Chromel alloy, is also shown. The lower portion of FIG. 1 represents the N-type materials. The compound BP may be modified to obtain N-type characteristics by doping with an additive such as sulfur, selenium or tellurium. It is seen that a greater thermoelectric power is obtained with BP, particularly at higher temperatures, than with the comparison materials indium arsenide, InAs, or the mixed binary indium arsenide phophide, $InAs_{0.9}P_{0.1}$.

Figure 2:
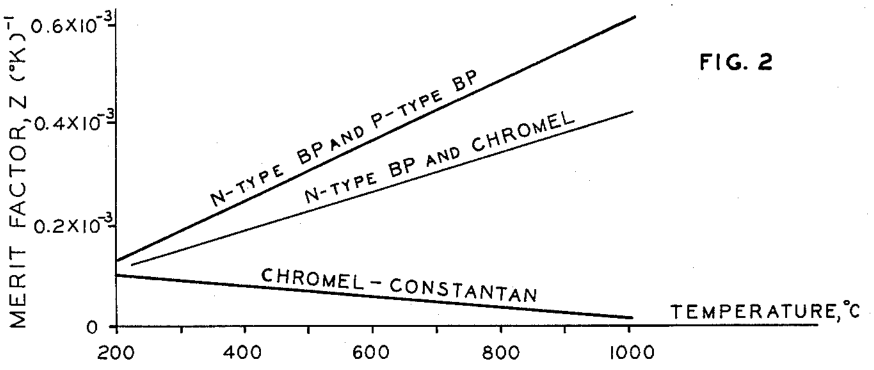
FIG. 2 represents the merit factor-temperature relationships for boron phosphide and other thermoelectric materials.

In FIG. 2, the merit factor, Z, as discussed above, is shown for certain thermocouple combinations. The reference materials Chromel-constantan are shown to have considerably inferior merit factors than the couple of Chromel N-type BP, and the couple of N-type BP with P-type BP.

Figure 3:
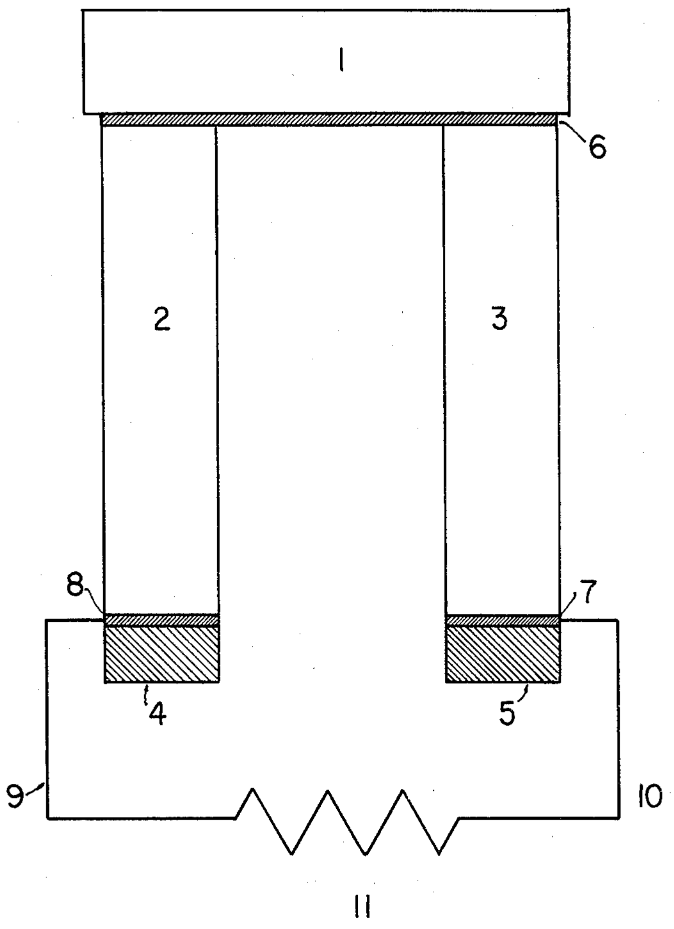
FIG. 3 shows a thermoelectric device using boron phosphide as thermoelectric elements.

FIG. 3 illustrates a thermoelectric device. In FIG. 3 the P-type thermoelement such as P-type BP is indicated by the numeral 2 and the N-type material such as N-type BP by the numeral 3. These two thermoelements are joined by a conventional conductor such as a copper bar, 6. Conventional conductors including soldered or welded joints are also employed as elements 7 and 8 to connect to an external circuit exemplified by leads 9 and 10. In the operation of this device, a heat source, 1, maintains the upper or reference junctions of ends of bars 2 and 3 at an elevated temperature, while the lower ends or reference junctions of bars 2 and 3 are kept cool by heat sinks 4 and 5. This system yields a direct current which can be delivered to the electrical load, 11, connected in series or parallel in order to obtain larger electrical effects.

In addition to the compound BP described above, the use of various modified or doped compositions is included in the present invention, whether these modifiers are chemically combined or physically dispersed, e.g. in the space lattice of the base material. When one adds a small amount, e.g. 5% of carbon to the BP, one finds that the merit factor, Z, of the material is improved. The preferred group of elements for modifying or doping the boorn phosphide is carbon, arsenic, antimony, nitrogen (as nitrides), silicon, germanium, aluminum, gallium, sulfur, tellurium, selenium, zinc, cadmium, mercury, nickel, beryllium, magnesium, iron, palladium, platinum, tungsten, molybdenum and tantalum.

The said elements are used as such and in compound forms, both stoichiometric and non-stoichiometric, for use as dopants or modifying agents. The proportion of the doping additive added to the above base of boron phosphide as the dopants or additives is broadly in the range of less than 15% by weight, or preferably from 0.005% to 15% by weight. A still more preferred range is from 0.01% to 10% by weight relative to the weight of the boron phosphide base material.

The mechanism by which modification of the thermoelectric properties is obtained by doping has not been completely elucidated. However, it has been found that the minute additions ($10^{14}$ to $10^{17}$ carriers per cc. of the matrix composition, that is from 0.000001% to 0.001% by weight) of additives or dopants characteristic of typical semi-conductor compositions, e.g., in transistors, rectifiers and diodes, are not effective in the present thermoelectric compositions.

The relative magnitude of additive concentration in the prior art semi-conductor region and the present thermoelectric region is shown in the following values of merit factor which are obtained with boron phosphide, BP, as the base material.

| Composition | Merit Factor, Z |
|---|---|
| BP | Less than $1\times10^{-5}$ |
| BP with 0.0001% S | Less than $1\times10^{-5}$ |
| BP with 1% S | Greater than $10\times10^{-5}$ |

In addition to the improvement of boron phosphide doping, it is also possible to improve the merit factor by the formation of mixed binary compositions. As an instance of such a modified composition, it is found that the merit factor for the composition $BP_xAs_{1-x}$ is improved relative to BP. The best improvement occurs when the arsenic to phosphorus ratio is greater than one; for example, $BP_{0.1}As_{0.9}$ has a merit factor at least 20% better than BP. When one prepares the compounds $B_xAl_{1-x}P$ or $BP_xN_{1-x}$ thermoelectric compositions with useful properties are also obtained.

The thermoelectric bodies described herein are employed as shaped blocks, rods, films or wires, etc. produced by suitable means. Preferred embodiments of the invention include uniform stoichiometric compounds and the non-stoichiometric materials having the dopants dispersed therein (e.g. in the space lattice of the boron phosphide matrix).

The following examples illustrate specific embodiments of the present invention:

*Example 1*

An example of the use of boron phosphide, BP, as an element of a thermocouple is shown in the following example.

The boron phosphide as a block having N-type conductivity (by the addition of 1% Te) is electrically joined to metallic Chromel wire as the P-type component. When this electrical junction is heated to a temperature of 1,000° C., with the reference junctions at room temperature, an electromotive force of 0.45 volt is obtained. This corresponds, with these particular materials, to a merit factor of $0.4\times10^{-3}$ ° K.$^{-1}$.

In general, the components of the couple are joined by suitable leads to the external load. An example of such a circuit is shown in FIG. 3. The electrical leads should be of good electrical and thermal conductivity.

*Example 2*

An example of the use of N and P-type boron phosphide for a thermoelectric couple is shown in the following experiment.

A boron phosphide block having N-type conductivity (by the addition of 1% sulfur) is electrically joined at one end to a P-type boron phosphide block (by the addition of 1% cadmium). When this junction is heated to a temperature of 1,000° C. and the reference junctions at the remote ends of the two blocks are maintained at room temperature, an electromotive force of 0.8 volt is obtained. This corresponds with these particular materials to a merit factor of $0.55\times10^{-3}$ ° K.$^{-1}$.

*Example 3*

In order to obtain a cooling (or heating) effect from the thermocouple system of Example 2, ten of the said couples are joined in series. A current of 10 amperes at 2 volts is passed through the system with the reference junctions maintained at 900° C. It is found that the cooled (or warmed) junctions reach a temperature of about 20° C. below (or above, respectively) the reference junction temperature.

In order to compare the thermoelectric properties of boron phosphide to other compositions, the following data shows the values for the thermoelectric power and also of the merit factor and optimum operating temperature representative of thermocouples based upon the following pairs:

| Thermocouple Material | Thermo-electric Power (microvolts/° C.) | Merit Factor (Z $10^3$ ° K.$^{-1}$) | Optimum Operating Temp., ° C. |
|---|---|---|---|
| N and P type BP | 800 | 0.55 | 1,000 |
| N type BP and Chromel | 450 | 0.4 | 1,000 |
| P type BP and constantan | 450 | 0.4 | 1,000 |

It is a particular advantage of the boron phosphide, BP, that this material maintains the desirable thermoelectric properties at unusually high temperatures such as in the range of from 400° C. to 1,500° C. The prior art thermoelectric materials have been found to lose their useful thermoelectric properties very radically in this high temperature range.

The preparation of a doped composition, such as BP modified by sulfur is readily conducted by conventional methods. For example when sulfur is used as the dopant, with BP, the sulfur is dispersed in the space lattice of the BP by mixing the sulfur with the elemental boron and phosphorus before reacting these components to form BP. Other methods include diffusion from vapor, liquid or solid additions into the base of boron phosphide. Another method is hot pressing, suitable, for example, in adding carbon to BP.

This application is a divisional application of copending U.S. application Serial No. 855,592, filed November 27, 1959, now abandoned.

What is claimed is:

1. A thermoelectric generating material consisting of boron phosphide, BP, containing dispersed therein as a modifying element from 0.005% to 15% by weight of at least one member selected from the group consisting of carbon, arsenic, antimony, nitrogen (as nitrides), silicon, germanium, aluminum, gallium, sulfur, tellurium, selenium, zinc, cadmium, mercury, beryllium, magnesium, nickel, iron, palladium, platinum, tungsten, molybdenum, and tantalum.

2. A thermoelectric generating material consisting of boron phosphide, BP, containing dispersed therein as a modifying element, sulfur which is present in the amount of 1% by weight.

3. A thermoelectric generating material consisting of boron phosphide having the formula BP containing dispersed therein as a modifying element, carbon which is present in the range of from 0.005 to 15% by weight.

4. A thermoelectric generating material which generates electricity at temperatures from 800° C. to 1500° C. consisting of boron phosphide, BP as a matrix containing from 0.005 to 15% by weight of at least one member selected from the group consisting of carbon, arsenic, antimony, nitrogen (as nitrides), silicon, germanium, aluminum, gallium, sulfur, tellurium, selenium, zinc, cadmium, mercury, beryllium, magnesium, nickel, iron, palladium, platinum, tungsten, molybdenum, and tantalum.

5. A thermoelectric couple suitable for use as an electric generator which generates electricity at temperatures of from 800° C. to 1500° C. which comprises as a first branch of said couple boron phosphide, BP, having dispersed therein from 0.005% to 15% by weight of at least one member selected from the group consisting of carbon, arsenic, antimony, nitrogen (as nitrides), silicon, germanium, aluminum, gallium, sulfur, tellurium, selenium, zinc, cadmium, mercury, beryllium, magnesium, nickel, iron, palladium, platinum, tungsten, molybdenum, and tantalum, and as a second branch of said couple boron phosphide, BP, having dispersed therein a like amount of at least one member selected from said group and having opposite conductivity type as said first branch, and electrical leads attached to said couple.

6. The thermocouple of claim 5 wherein said first branch consists of boron phosphide, BP, having dispersed therein 1% by weight of sulfur to produce N-type conductivity and said second branch consists of boron phosphide, BP, having dispersed therein 1% by weight of cadmium to produce P-type conductivity.

7. Process for the production of electricity which comprises applying heat at temperatures from 400° C. to 1500° C. to one end of a thermoelectric couple while cooling the other end thereof, withdrawing a current from the said thermocouple, the said body having at least one electrical component composed of boron phosphide, BP, having dispersed therein from 0.005 to 15% by weight of at least one member selected from the group consisting of carbon, arsenic, antimony, nitrogen (as nitrides), silicon, germanium, aluminum, gallium, sulfur, tellurium, selenium, zinc, cadmium, mercury, beryllium, magnesium, nickel, iron, palladium, platinum, tungsten, molybdenum, and tantalum.

8. Process for the production of electricity which comprises applying heat at temperatures of from 400° C. to 1500° C. to one end of a thermoelectric couple consisting of boron phosphide, BP, of N-type conductivity, by the addition of 1% sulfur, while cooling the other end which consists of boron phosphide, BP, of P-type conductivity, by the addition of 1% cadmium, and withdrawing a current from the said thermocouple.

9. Process for cooling a medium which comprises contacting the said medium with an end of a thermoelectric couple in which at least one electrical element is composed of boron phosphide, BP, having dispersed therein from 0.005 to 15% by weight of at least one member selected from the group consisting of carbon, arsenic, antimony, nitrogen (as nitrides), silicon, germanium, aluminum, gallium, sulfur, tellurium, selenium, zinc, cadmium, mercury, beryllium, magnesium, nickel, iron, palladium, platinum, tungsten, molybdenum and tantalum, the said thermoelectric couple having electrical leads connected thereto, and passing a polarized electric current through the said couple whereupon the end of the body is cooled and the medium in contact therewith is cooled.

10. Process for heating a medium which comprises contacting the said medium with an end of a thermoelectric couple in which at least one electrical element is composed of boron phosphide, BP, having dispersed therein from 0.005 to 15% by weight of at least one member selected from the group consisting of carbon, arsenic, antimony, nitrogen (as nitrides), silicon, germanium, aluminum, gallium, sulfur, tellurium, selenium, zinc, cadmium, mercury, beryllium, magnesium, nickel, iron, palladium, platinum, tungsten, molybdenum and tantalum, the said thermoelectric couple having electrical leads connected thereto, and passing a polarized electric current through the said couple whereupon the end of the body is heated and the medium in contact therewith is heated.

References Cited in the file of this patent

UNITED STATES PATENTS

| | | |
|---|---|---|
| 2,798,989 | Welker | July 9, 1957 |
| 2,858,275 | Folberth | Oct. 28, 1958 |
| 2,921,973 | Heihes et al. | Jan. 19, 1960 |
| 2,953,616 | Pessel et al. | Sept. 20, 1960 |

FOREIGN PATENTS

| | | |
|---|---|---|
| 748,847 | Great Britain | May 6, 1956 |